(12) United States Patent
Luo

(10) Patent No.: US 12,286,688 B2
(45) Date of Patent: Apr. 29, 2025

(54) METHOD FOR RECYCLING SILVER PRESENT ON A PHOTOVOLTAIC CELL

(71) Applicant: ROSI, Grenoble (FR)

(72) Inventor: Yun Luo, Schupfen (CH)

(73) Assignee: ROSI, Grenoble (FR)

( * ) Notice: Subject to any disclaimer, the term of this patent is extended or adjusted under 35 U.S.C. 154(b) by 800 days.

(21) Appl. No.: 17/595,811

(22) PCT Filed: May 25, 2020

(86) PCT No.: PCT/FR2020/050869
§ 371 (c)(1),
(2) Date: Nov. 24, 2021

(87) PCT Pub. No.: WO2020/240126
PCT Pub. Date: Dec. 3, 2020

(65) Prior Publication Data
US 2022/0228235 A1    Jul. 21, 2022

(30) Foreign Application Priority Data
May 29, 2019   (FR) ...................................... 1905739

(51) Int. Cl.
C22B 7/00       (2006.01)
C22B 11/00      (2006.01)
H10F 77/20      (2025.01)

(52) U.S. Cl.
CPC ............ *C22B 7/007* (2013.01); *C22B 11/042* (2013.01); *C22B 11/046* (2013.01); *H10F 77/211* (2025.01)

(58) Field of Classification Search
USPC ......................................................... 423/23
See application file for complete search history.

(56) References Cited

U.S. PATENT DOCUMENTS

| 2016/0053343 A1 | 2/2016 | Palitzsch |
| 2017/0092528 A1 | 3/2017 | Tseng et al. |
| 2018/0291477 A1 | 10/2018 | Tao et al. |

FOREIGN PATENT DOCUMENTS

| CN | 102629644 A | * | 8/2012 |
| CN | 103606595 A | | 2/2014 |

(Continued)

OTHER PUBLICATIONS

CRC Materials Science and Engineering Handbook (4th Edition). Table 1.15. Solid Density of Selected Elements. Retrieved from https://app.knovel.com/hotlink/itble/rcid:kpCRCMSEOB/id:kt00XRDQQ1/crc-materials-science/table-1-15-solid-density (2015). (Year : 2015).*

(Continued)

*Primary Examiner* — Daniel Berns
*Assistant Examiner* — Zachary John Baum
(74) *Attorney, Agent, or Firm* — TraskBritt

(57) ABSTRACT

A method for recycling silver present on a photovoltaic cell comprising: —a step a) of supplying a photovoltaic cell including—a support substrate made of silicon, —an upper layer of doped silicon arranged on the support substrate, —a plurality of silver lines arranged on the upper layer, —at least one anti-reflective layer arranged on the upper layer and adjacent to the silver lines; —a step b) of etching the anti-reflective layer by immersing the photovoltaic cell in an acid solution; —a step c) of etching the upper layer by immersing the photovoltaic cell without an anti-reflective layer in a basic solution, leading to the separation of the silver lines; —a step d) of drying the assembly formed by the support substrate and the separated silver lines; —a step e) of extracting the silver lines in the solid state.

17 Claims, 1 Drawing Sheet

(56) References Cited

FOREIGN PATENT DOCUMENTS

| | | | | | |
|---|---|---|---|---|---|
| CN | 105355541 | A | | 2/2016 | |
| CN | 107321766 | A | | 11/2017 | |
| DE | 102007034441 | | | 6/2020 | |
| GB | 2184601 | A | * | 6/1987 | ..... H01L 31/022425 |
| JP | 2005166814 | A | * | 6/2005 | |
| JP | 2006093336 | A | * | 4/2006 | |
| KR | 10-1539528 | B1 | | 7/2015 | |
| KR | 10-2016-0027325 | A | | 3/2016 | |
| TW | 200836850 | A | | 9/2008 | |
| WO | WO-2006013568 | A2 | * | 2/2006 | ........... C22B 11/046 |
| WO | 2015/130607 | A1 | | 9/2015 | |
| WO | 2017/100443 | A1 | | 6/2017 | |

OTHER PUBLICATIONS

English translation of JP-2006093336-A Description (Year: 2006).*
English translation of JP-2005166814-A Description (Year: 2005).*
English translation of CN-102629644-A Description (Year: 2012).*
French Search Report for Application No. 1905739 dated Mar. 13, 2020, 2 pages.
International Written Opinion for International Application No. PCT/FR2020/050869 dated Sep. 30, 2020, 4 pages.
Lei et al., Study on the Technology of Recycling High Purity Silicon Wafers From Waste Polycrystalline Silicon Solar Cells, Semiconductor Technology, vol. 42, Issue 8, (Aug. 31, 2017), pp. 626-630.
Japanese Office Action for Application No. 2021-570787 dated Feb. 26, 2024, 6 pages.
Anonymous, Pure 999 Silver Electrodes 2 Strips 11 cm x 2.5 mm for: Amazon.co.uk:Electronics, Apr. 26, 2017, Retrieved from the Internet: https://www.amazon.co.uk/silver?lectrodes-stripsproduction-colloidal/dp/B06ZZ2HGSP[retrieved on Mar. 10, 2020] XP055675486, 4 pages.
International Search Report for International Application No. PCT/FR2020/050869 dated Sep. 30, 2020, 3 pages.

* cited by examiner

METHOD FOR RECYCLING SILVER PRESENT ON A PHOTOVOLTAIC CELL

CROSS-REFERENCE TO RELATED APPLICATIONS

This application is a national phase entry under 35 U.S.C. § 371 of International Patent Application PCT/FR2020/050869, filed May 25, 2020, designating the United States of America and published as International Patent Publication WO 2020/240126 A1 on Dec. 3, 2020, which claims the benefit under Article 8 of the Patent Cooperation Treaty to French Patent Application Serial No. FR1905739, filed May 29, 2019.

TECHNICAL FIELD

The present disclosure relates to the field of solar modules and microelectronic components. It relates, in particular, to a method for recycling silver present on a photovoltaic cell.

BACKGROUND

Silver is the most valuable material in solar modules. In fact, in photovoltaic cells, the metal grid for the collection of electric charges generated by solar energy is usually formed by thin lines of silver tens of microns thick. It can be estimated that, at the end of life of solar modules corresponding to a power of 1 MWatt, the value of the silver material is currently approximately $25 k.

Many of the methods proposed for extracting silver from solar modules and recycling it are based on a hydrometallurgical process, which involves the complete dissolution of the silver followed by either its transformation in the form of a complex in a salt, or by a deposition in the form of pure metal.

The most widely used solvent for dissolving silver is nitric acid, as described, in particular, in DE102007034441 and CN105355541. US2016053343 provides a variant based on the reaction of silver with sulfonic acid in the presence of an oxidizing agent. Another variant set out in WO2015130607 involves dissolving silver using a solution composed of an oxidizing agent, halide, acid and solvent.

Naturally, these are just a few examples of methods; other methods based on dissolving silver exist. In any case, the overall process is generally long and complex as it requires switching from the solid form of silver to its liquid form, then back to its solid form.

Alternatively, certain methods, as disclosed by US2017092528, provide for the peeling of metal surface layers by adhesion and transfer onto an adhesive tape. The metal layers are then separated from the adhesive in a liquid solution.

BRIEF SUMMARY

The present disclosure provides an alternative solution to those in the prior art. It relates to a simple and economical method for recycling silver present on photovoltaic cells.

More particularly, the present disclosure relates to a method for recycling silver present on a photovoltaic cell, comprising:
a step a) of supplying a photovoltaic cell including:
a support substrate made of silicon and having a front face and a rear face,
an upper layer of doped silicon, of a doping type opposite to that of the support substrate, arranged on the front face,
a plurality of silver lines arranged on the upper layer, and
at least one anti-reflective layer arranged on the upper layer and adjacent to the silver lines;
a step b) of etching the anti-reflective layer by immersing the photovoltaic cell in an acid solution;
a step c) of etching the upper layer by immersing the photovoltaic cell devoid of the anti-reflective layer, in a basic solution, leading to the separation of the silver lines;
a step d) of drying the assembly formed by the support substrate and the separated silver lines; and
a step e) of extracting the silver lines in the solid state.

According to other advantageous and non-limiting features of the present disclosure, taken alone or in any technically feasible combination:
steps b) and c) comprise rinsing with deionized or ultrapure water prior to the subsequent step;
ultrasound is applied during all or part of steps b) and/or c) at a frequency between 40 kHz and 100 kHz, advantageously 80 kHz,
the acid solution used in step b) is hydrofluoric acid having a concentration of between 0.5% and 48%, advantageously between 0.5% and 5%;
the basic solution used in step c) is sodium hydroxide having a concentration of between 1 and 30%, advantageously 3%;
the etching of step c) is carried out at a temperature of between 20° C. and 100° C., advantageously at 50° C.;
the extracting of step e) is carried out by density difference or by sieving in order to separate the silver lines and the support substrate;
extraction by density difference is based on a blower or vibration method;
the photovoltaic cell includes:
a lower layer of doped silicon, of the same doping type as that of the support substrate, arranged on the rear face of the support substrate,
an intermediate layer of a silicon and aluminum alloy arranged on the lower layer, and
a rear contact layer of aluminum;
step b) of the method etches or disaggregates the rear contact layer;
step c) of the method etches the intermediate layer and the lower layer; and
the recycling method comprises, after step e), a step f) of reusing the support substrate.

The present disclosure also relates to the silver lines in solid form resulting from the aforementioned recycling method.

The present disclosure further relates to the use of the silver lines for producing a conductive silver-based adhesive and/or for producing silver or electrolyte electrodes for an electrolytic deposition.

BRIEF DESCRIPTION OF THE DRAWINGS

Other features and advantages of the present disclosure will become apparent from the following detailed description of the present disclosure, with reference to the attached drawings, in which.

DETAILED DESCRIPTION

In the descriptive part, the same references in the figures may be used for the same type of elements. The drawings are schematic representations that, for the sake of readability, are not to scale. In particular, the thicknesses of the layers along the z axis are not to scale with respect to the lateral dimensions along the x and y axes; and the relative thicknesses of the layers between them are not necessarily respected in the figures.

The present disclosure relates to a method for recycling silver present on a photovoltaic cell.

In the present disclosure, photovoltaic cell means a silicon-based component comprising:
- the semiconductor layers required to form a PN junction capable of transforming light energy into electrical charges,
- the metal layers required to collect the charges and form the contacts at the terminals of which a potential difference will be established, and
- at least one anti-reflective layer arranged on the face intended to be illuminated, making it possible to limit the losses by reflection of the solar radiation.

Figure 1:
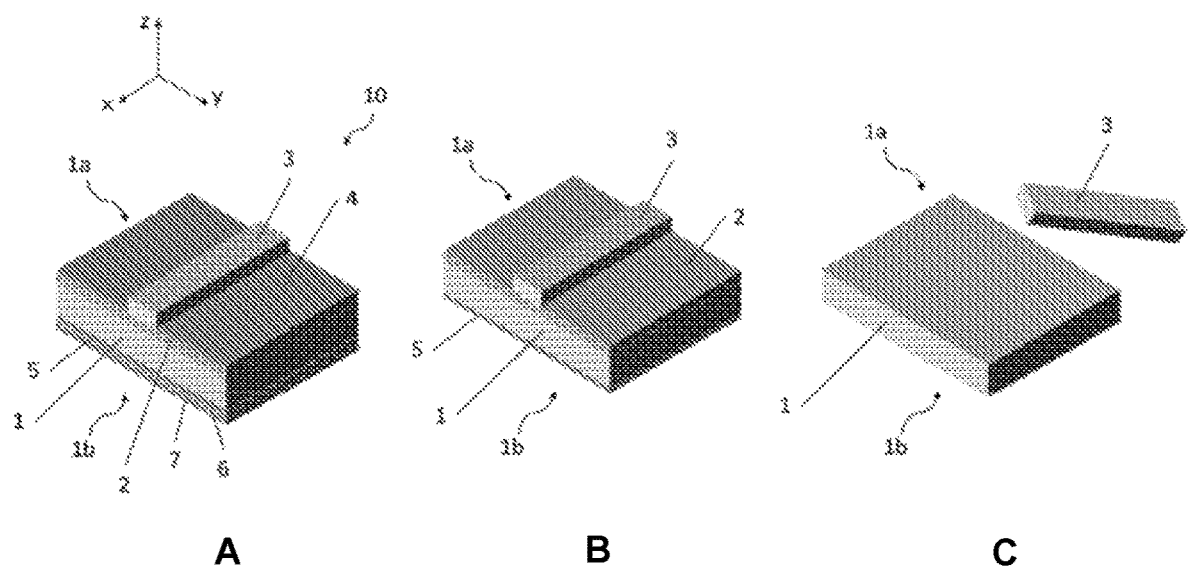
FIGS. 1A-1C and 2A-2C show steps of the recycling method according to the present disclosure.
Figure 2:
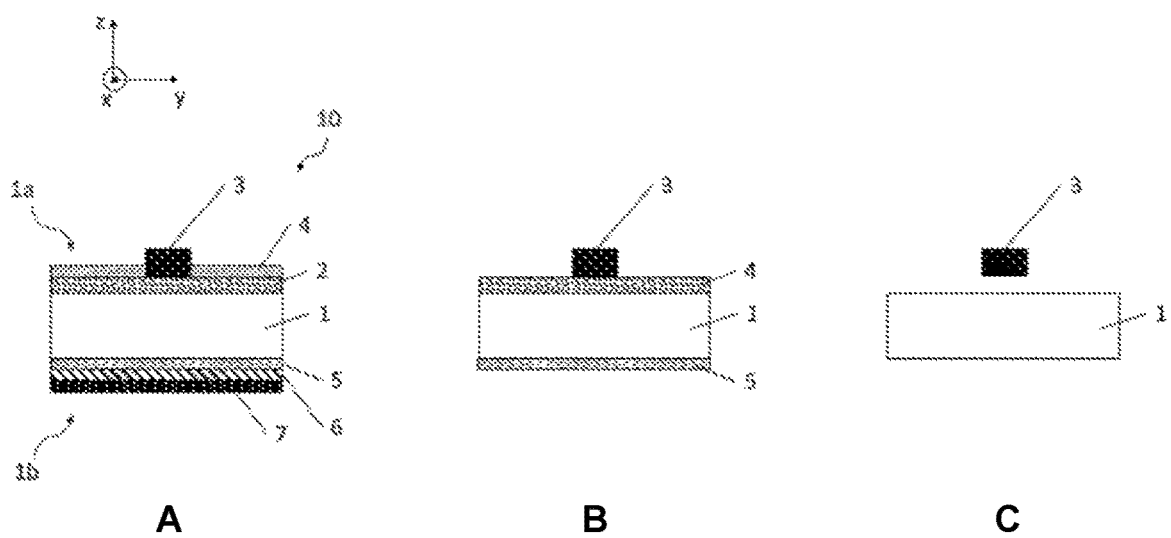

The recycling method according to the present disclosure comprises a first step a) of supplying a photovoltaic cell 10 (FIG. 1A and FIG. 2A). The cell comprises a lightly doped support substrate 1 made of silicon and having a front face 1a and a rear face 1b. The doping level (usually P-type, but possibly N-type) is typically around $10^{16}$ cm$^{-3}$ corresponding to a resistivity of approximately 1 ohm·cm.

The photovoltaic cell 10 also comprises an upper layer 2 of doped silicon arranged on the front face 1a of the support substrate 1. In particular, the upper layer 2 has a type of doping opposite to that of the support substrate 1. The resistivity of the upper layer 2 is typically approximately 75 ohms/sq. For example, if the support substrate 1 is P-type doped (boron doping), the upper layer 2 is N-type doped (phosphorus doping). The layer forms, together with the support substrate 1, a PN junction to separate the reverse polarity charges (electrons and holes) when these are generated in the cell 10 under illumination. The upper layer 2 typically has a thickness of less than 1 micron.

Advantageously, a lower layer 5 of highly doped silicon, of the same doping type as that of the support substrate 1, is arranged on the rear face 1b of the support substrate 1. The lower layer 5 has, for example, a thickness of approximately 5 microns with a maximum concentration of dopants of approximately $3\times10^{18}$ cm$^{-3}$ to $4\times10^{18}$ cm$^{-3}$.

The photovoltaic cell 10 further comprises a plurality of silver lines 3 arranged on the upper layer 2. These silver lines constitute the metal contacts for collecting the charges generated in the underlying semiconductor structure and are distributed relatively uniformly on the upper layer 2. They are generally composed of a silver alloy comprising between 93% and 97% silver. Without being limiting, these silver lines 3 may have a thickness of approximately 20 microns and a width of approximately 100 microns, and may be spaced apart by a distance typically of 2 mm.

Advantageously, the photovoltaic cell 10 also comprises one or more contacts on the side of the rear face 1b of the support substrate 1. In particular, a rear contact layer 7 of aluminum is usually arranged on the lower layer 5. For example, this rear contact layer 7 may have a thickness of approximately one to a few tens of microns.

Due to the diffusion of aluminum in the silicon during the thermal treatments for making the cell 10, an intermediate layer 6, an alloy of silicon and aluminum, may be present between the lower layer 5 made of silicon and the rear contact layer 7. The thickness of the intermediate layer 6 may vary, for example, by around 10 microns.

When solar radiation is projected onto such a functional photovoltaic cell 10, the charges of opposite polarity generated in the semiconductor structure are respectively collected on the silver lines 3 and on the rear contact layer 7, providing a potential difference between these two metal contacts.

The photovoltaic cell 10 also comprises at least one anti-reflective layer 4 arranged on the upper layer 2 and adjacent to the silver lines 3. Usually, the anti-reflective layer is made of silicon nitride (SiN) or even of titanium oxide. In the case of silicon nitride, it has a thickness of approximately 75 nm.

Naturally, with the present method being intended for recycling a photovoltaic cell 10, it aims to process cells at the end of their life, defective cells, or cells from off-specification solar modules (production rejects).

The recycling method according to the present disclosure then comprises a step b) of etching the anti-reflective layer 4 by immersing the cell 10 in an acid solution (FIG. 1B and FIG. 2B). The acid solution can be selected according to the nature of the anti-reflective layer 4. In particular, for an anti-reflective layer 4 of silicon nitride, the acid solution is hydrofluoric acid (HF) having a concentration of between 0.5% and 48%. Preferably, the HF concentration is between 0.5% and 5%. The etching time, for example, for a SiN layer of 75 nm, is approximately 10 min. The etching time may obviously vary as a function of the concentration of the acid solution and as a function of the thickness of the anti-reflective layer 4.

Alternatively, the acid solution may comprise a mixture of hydrofluoric acid and hydrogen peroxide.

The rear contact layer 7 is advantageously etched and/or disaggregated by the acid solution during step b). In the case of HF etching, the rear contact layer 7 made of aluminum will separate and disaggregate in the solution. The aluminum residues, in the form of a film in suspension, are removed during rinsing, which completes step b).

Etching step b) is followed by rinsing with deionized or ultra-pure water before the next step is carried out. Rinsing may advantageously be carried out by overflowing the bath in which the cell 10 devoid of its anti-reflective layer 4 is immersed.

Advantageously, etching step b) is carried out while ultrasound is applied at a frequency of between 40 kHz and 100 kHz. Ultrasound improves the efficiency of the etching of the anti-reflective layer 4 and promotes the separation of the rear contact layer 7. Ultrasound may also initiate local separation of the silver lines 3. Preferably, the frequency of the ultrasound is selected to 80 kHz in order to avoid breaking the silver lines 3 during the beginning of their separation.

The recycling method according to the present disclosure then comprises a step c) of etching the upper layer 2 by immersing the cell 10 devoid of its anti-reflective layer 4 (and possibly without its rear contact layer 7) in a basic solution: the etching of the upper layer 2 leads to the separation of the silver lines 3 from the support substrate 1 (FIG. 1C and FIG. 2C).

The basic solution used for etching step c) is preferably sodium hydroxide (NaOH) having a concentration of between 1 and 30%. This solution is advantageous in that it has an easily controllable etching speed. For example, for a concentration of NaOH at 3%, the etching speed is approximately 0.5 microns/min at 50° C. It also has good selectivity with respect to silver: the silver lines 3 are therefore not degraded during this etching step.

Alternatively, a solution of TMAH (tetramethylammonium hydroxide) can be used to etch the upper layer 2.

Etching step c) is carried out at a temperature of between 20° C. and 100° C., preferably at 50° C. This allows, in particular, higher etching speeds to be achieved. Depending on the thickness of the upper layer 2, etching may have a duration of between a few minutes and an hour.

Advantageously, the intermediate layer 6 of aluminum silicide is also etched by the basic solution during step c), in particular, in the case of an NaOH etching.

According to an advantageous embodiment, ultrasound is applied during all or part of step c) at a frequency of between 40 kHz and 100 kHz in order to increase the efficiency of the etching and the separation of the silver lines 3. Preferably, this frequency is defined at 80 kHz in order to limit the breakage of the silver lines 3, which are intended to be completely separated and free in the solution at the end of step c).

Etching step c) is followed by rinsing with deionized or ultra-pure water before the next step is carried out. Rinsing may advantageously be carried out by overflowing the bath in which the support substrate 1 and the free silver lines 3 are immersed (that is to say separated from the support substrate 1).

The following step d) of the recycling method comprises drying the assembly formed by the support substrate 1 and the separated silver lines 3. This drying is preferably carried out statically, for example, in an oven at a temperature slightly higher than room temperature.

Lastly, the recycling method according to the present disclosure comprises a step e) of extracting the silver lines 3 in the solid state. Advantageously, this extracting step is carried out by density difference. This step can be based on a known method of blowing or vibration, capable of physically detaching the free silver lines 3 from the support substrate 1. In some cases, a sieving method also allows effective detachment of the silver lines 3 from the support substrate 1.

The method for recycling the silver lines 3 according to the present disclosure is particularly advantageous compared to the techniques in the prior art in that it is simple to implement and the quantity of silver is almost fully recovered, the lines 3 not being degraded or being only slightly degraded during the steps.

The present disclosure also relates to the free silver lines 3 in solid form resulting from the aforementioned recycling method. Silver lines in solid form here means the whole and complete silver lines, as well as the silver line fragments, that all result from the method.

These silver lines 3 or fragments may be used for producing conductive silver-based adhesives. For this purpose, it is possible, for example, to mix them with one or more polymer ingredients and/or other compounds.

The silver lines 3 or fragments may also be used for producing silver electrodes (in solid form) or electrolyte electrodes (dissolved in solution) intended for carrying out electrolytic deposition.

The recycling method according to the present disclosure may also comprise a step f) of reusing the support substrate 1. In effect, after step e) comprising the physical detachment of the free silver lines 3 from the support substrate 1, the front and rear faces of the support may be completely devoid of doped layers (upper layer 2 and lower layer 5), metal or alloy layers (silver lines 3, rear contact layer 7 and intermediate layer 6) and the anti-reflective layer 4. The support substrate 1 extracted in step e) has a very high level of purity. It can thus be reintroduced into a silicon die, for example, for the production of trichlorosilane (TCS) or of "feedstock" silicon by DSS (directional segregation system).

Naturally, the present disclosure is not limited to the embodiments and to the examples described, and it is possible to make variants of the embodiments without departing from the scope of the invention as defined by the claims.

The invention claimed is:

1. A method for recycling silver present on a photovoltaic cell, comprising:
    a step a) of supplying a photovoltaic cell including:
        a support substrate comprising silicon and having a front face and a rear face;
        an upper layer of doped silicon, the upper layer having a doping type opposite to that of the support substrate, the upper layer arranged on the front face of the support substrate;
        a plurality of silver lines arranged on the upper layer; and
        at least one anti-reflective layer arranged on the upper layer and adjacent to the silver lines;
    a step b) of etching the anti-reflective layer by immersing the photovoltaic cell in an acid solution comprising hydrofluoric acid at a concentration of between 0.5% and 5% by weight based on a total weight of the acid solution, wherein the silver lines remain at least partially attached to the upper layer;
    a step c) of etching the upper layer by immersing the photovoltaic cell, devoid of the anti-reflective layer, in a basic solution, leading to the separation of the silver lines, wherein ultrasound is applied during all or part of step c) at a frequency between 40 kHz and 100 kHz;
    a step d) of drying the assembly formed by the support substrate and the separated silver lines; and
    a step e) of extracting the silver lines in the solid state.

2. The method of claim 1, wherein step b) comprises rinsing with deionized or ultra-pure water, and wherein step c) comprises rinsing with deionized or ultra-pure water prior to step d).

3. The method of claim 2, further comprising applying ultrasound to the photovoltaic cell during all or part of step b) at a frequency of between 40 kHz and 100 kHz.

4. The method of claim 1, wherein the basic solution used in step c) is sodium hydroxide having a concentration of between 1% and 30% by weight based on a total weight of the basic solution.

5. The method of claim 4, wherein the etching of step c) is carried out at a temperature of between 20° C. and 100° C.

6. The method of claim 1, wherein the extracting of step e) is carried out by density difference or by sieving in order to separate the silver lines and the support substrate.

7. The method of claim 6, wherein extraction by density difference is based on a blower or vibration method.

8. The method of claim 5, further comprising, after step e), a step f) of reusing the support substrate.

9. The method of claim 5, wherein the silver lines resulting from step e) are used for producing a conductive silver-based adhesive and/or for producing silver or electrolyte electrodes for an electrolytic deposition.

10. The method of claim 1, further comprising applying ultrasound to the photovoltaic cell during all or part of step b) at a frequency between 40 kHz and 100 kHz.

11. The method of claim 10, wherein applying ultrasound to the photovoltaic cell at a frequency between 40 kHz and 100 kHz comprises applying the ultrasound to the photovoltaic cell at a frequency of 80 KHz.

12. The method of claim 1, wherein the basic solution used in step c) is sodium hydroxide having a concentration of between 1% and 30% by weight based on a total weight of the basic solution.

13. The method of claim 12, wherein the sodium hydroxide has a concentration of 3% by weight based on a total weight of the basic solution.

14. The method of claim 1, wherein the etching of step c) is carried out at a temperature of between 20° C. and 100° C.

15. The method of claim 14, wherein the etching of step c) is carried out at a temperature of 50° C.

16. The method of claim 1, further comprising, after step e), a step f) of reusing the support substrate.

17. The method of claim 1, wherein the silver lines resulting from step e) are used for producing a conductive silver-based adhesive and/or for producing silver or electrolyte electrodes for an electrolytic deposition.

* * * * *